(12) United States Patent
Hisai et al.

(10) Patent No.: US 7,017,658 B2
(45) Date of Patent: Mar. 28, 2006

(54) HEAT PROCESSING DEVICE

(75) Inventors: Akihiro Hisai, Kyoto (JP); Junichi Yoshida, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 262 days.

(21) Appl. No.: 10/352,300

(22) Filed: Jan. 27, 2003

(65) Prior Publication Data
US 2003/0192686 A1    Oct. 16, 2003

(30) Foreign Application Priority Data
Jan. 31, 2002  (JP) ............................. P2002-023696
Nov. 28, 2002  (JP) ............................. P2002-345943

(51) Int. Cl.
   *F25B 29/00*    (2006.01)
(52) U.S. Cl. ...................... 165/201; 165/206; 165/263; 165/80.5; 219/444.1; 118/724; 156/345.52; 156/345.53
(58) Field of Classification Search ................ 165/201, 165/260, 263, 80.2, 80.3, 80.5, 104.21, 104.33, 165/206; 219/390, 444.1; 118/724, 728, 118/52; 156/345.52, 345.53, 345.54
See application file for complete search history.

(56) References Cited

U.S. PATENT DOCUMENTS

| | | | |
|---|---|---|---|
| 4,956,043 A * | 9/1990 | Kanetomo et al. ..... 156/345.52 |
| 5,220,171 A * | 6/1993 | Hara et al. ............. 165/104.21 |
| 5,846,375 A * | 12/1998 | Gilchrist et al. ........ 156/345.52 |
| 5,927,077 A * | 7/1999 | Hisai et al. .............. 219/444.1 |
| 6,080,969 A * | 6/2000 | Goto et al. ................. 118/724 |
| 6,226,073 B1 * | 5/2001 | Emoto ......................... 355/30 |
| 6,229,116 B1 * | 5/2001 | Shirakawa et al. ......... 118/728 |
| 6,332,724 B1 * | 12/2001 | Yano et al. .................... 118/52 |
| 6,736,206 B1 * | 5/2004 | Hisai .......................... 165/263 |
| 6,744,020 B1 * | 6/2004 | Shirakawa et al. ...... 219/444.1 |
| 6,810,298 B1 * | 10/2004 | Emoto ........................ 165/206 |
| 6,824,616 B1 * | 11/2004 | Kitano et al. ................. 118/50 |

FOREIGN PATENT DOCUMENTS

| | | |
|---|---|---|
| JP | 11-314224 | 11/1999 |
| JP | 2001-313328 | 11/2001 |

\* cited by examiner

*Primary Examiner*—Ljiljana Ciric
(74) *Attorney, Agent, or Firm*—Ostrolenk, Faber, Gerb & Soffen, LLP

(57) ABSTRACT

A heating unit having a heat pipe structure includes a heater and a cooling pipe disposed in an inner space of a holding table. The holding table and the cooling pipe are thermally insulated by a heat-insulating member, so that it is possible to prevent direct heat transfer from the cooling pipe to the holding table. Therefore, it is possible to rapidly perform a cooling processing while keeping the evenness of the temperature distribution of the mounting face and the temperature distribution of the substrate mounted on the mounting face, and consequently to appropriately keep the evenness of the film thickness and the line width of a wiring layer formed on the substrate upon heat processing.

5 Claims, 11 Drawing Sheets

F I G. 2
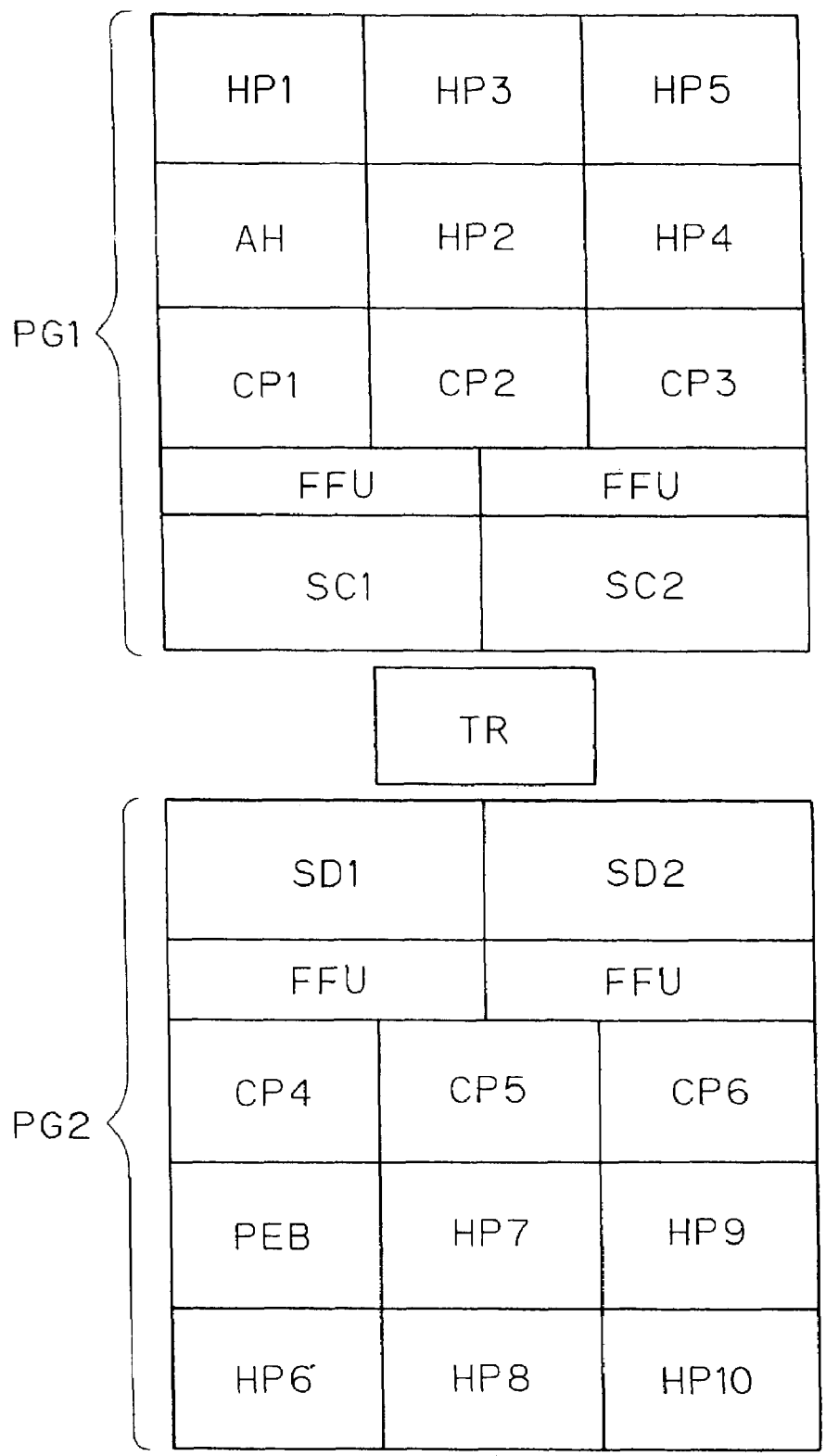

HEAT PROCESSING DEVICE

BACKGROUND OF THE INVENTION

1. Field of the Invention

The present invention relates to a heat processing device which performs a heat processing on a semiconductor substrate, a glass substrate for a liquid crystal display, a glass substrate for a photo-mask, a substrate for an optical disk, and the like (hereinafter, referred to as "substrate").

2. Description of the Background Art

As a heat processing device for rapidly heating or cooling a substrate, a heat processing device as shown in FIG. 7 has been known (see Japanese Patent Application Laid-Open No. 2001-313328, for example).

FIG. 7 shows the configuration of a main part of a conventional heat processing device. A heat processing device 100 shown in FIG. 7 includes a holding table 101 employing a heat pipe structure HS so that its heat capacity is considerably reduced while the in-plane evenness of the temperature distribution is enhanced. A substrate W is mounted on a mounting face 101a corresponding to an upper surface thereof.

A cavity is formed inside the holding table 101. An inner space 102 thereof is depressurized due to the heat pipe structure HS, and a plurality of pillars 103 are erected so as to compensate for the strength thereof in the vertical direction.

A heater 105 is installed inside a working liquid room 104 in which working fluid 106 is stored. Moreover, the working liquid room 104 and the inner space 102 of the holding table 101 are communicated with each other. Therefore, steam of the working fluid 106, which is generated by heating the heater 105, is allowed to shift through the inner space 102 and transfer or receive latent heat of vaporization so that the mounting face 101a is heated rapidly with the temperature distribution of the mounting face 101a being kept evenly.

A cooling plate 107 is attached to a position that is interposed between two working fluid rooms 104. A flow passage, which is not shown, is formed inside the cooling plate 107, and a refrigerant is supplied into the flow passage through a supply pipe 108. After heat exchange has been performed inside the flow passage, the refrigerant is discharged from a discharging pipe 109 so that the holding table 101 is cooled rapidly.

However, upon cooling the holding table 101 by supplying the refrigerant to the cooling plate 107, depending on the heat capacity, the temperature conditions and the like of the refrigerant, the thermal transfer from the mounting face 101a to the cooling plate 107 through the pillars 103 becomes more influential than the function of the heat pipe structure HS for keeping the temperature distribution of the mounting face 101a evenly, resulting in unevenness in the temperature distribution of the mounting face 101a. Therefore, when temperature controls are performed through a heating processing using the heater 105 and a cooling processing using the cooling plate 107 so as to process a wafer with a substrate W being held on the holding table 101 of the heat processing device as disclosed in Japanese Patent Application Laid-Open No. 2001-313328, the temperature distribution on the substrate W becomes uneven, resulting in deterioration in the film-thickness evenness and the line-width evenness in a circuit pattern to be formed on the substrate W.

SUMMARY OF THE INVENTION

The present invention is directed to a device for performing a heat processing on a substrate.

According to the present invention, a heat processing device includes: a holding table which includes a housing having therein an inner space serving as a working domain of working fluid in a heat pipe structure and which mounts a substrate on an upper face side of the housing; a heating part which is attached to the holding table to heat the holding table through the heat pipe structure; and a cooling part which has a cooling structure disposed in the inner space and which cools the holding table by the cooling structure.

It is therefore possible to rapidly cool the substrate mounted on the holding table without impairing the evenness of the temperature distribution on the substrate, and consequently to appropriately keep the evenness of the film thickness and the evenness of the line width of the substrate which is subjected to a heat processing.

Preferably, the heat processing device further includes a temperature controlling part which controls the heating part and the cooling part to keep the temperature of the holding table at a predetermined temperature.

Therefore, even when the temperature of the holding table fluctuates, it is possible to rapidly recover the temperature to a predetermined temperature.

According to one aspect of the present invention, a heat processing device includes: a holding table which can mount a substrate thereon and which has a heat pipe structure therein; a heating part which is attached to the holding table to heat the holding table through the heat pipe structure; a first cooling part which is thermally coupled to working fluid of the heat pipe structure, and which has a cooling structure for cooling the working fluid; and a second cooling part which has a second cooling structure brought into contact with and disposed on a lower face side of the housing, and which cools the holding table by the second cooling structure.

Since the cooling structure is thermally coupled to the working fluid of the heat pipe structure and performs a cooling processing, it is possible to rapidly cool the substrate mounted on the holding table without impairing the evenness of the temperature distribution on the substrate, and consequently to appropriately keep the evenness of the film thickness and the evenness of the line width of the substrate which is subjected to a heat processing.

Moreover, by using the first and second cooling elements in a separate manner, it is possible to rapidly drop the set temperature and also to finely adjust the set temperature so as to perform a temperature control with high precision.

According to another aspect of the present invention, the heat processing device includes: a holding table which includes a housing having therein an inner space serving as a working domain of working fluid in a heat pipe structure and which mounts a substrate on an upper face side of the housing; a heating part which is attached to the holding table to heat the holding table through the heat pipe structure; a first cooling part which has a first cooling structure disposed in the inner space and which cools the holding table by the first cooling structure; a second cooling part which has a second cooling structure brought into contact with and disposed on a lower face side of the housing, and which cools the holding table by the second cooling structure; and a controlling part which controls the cooling state of the first cooling part and the cooling state of the second cooling part.

It is therefore possible to control the temperature of the holding table with higher precision.

The present invention is also directed to a device for performing a predetermined processing on a substrate.

According to the present invention, a substrate processing device includes: a thermal unit which includes a holding table which includes a housing having therein an inner space serving as a working domain of working fluid in a heat pipe structure and which mounts a substrate on an upper face side of the housing, a heating part which is attached to the holding table to heat the holding table through the heat pipe structure, and a cooling part which has a cooling structure disposed in the inner space and which cools the holding table by the cooling structure; and a transportation mechanism which transports the substrate to the thermal unit.

It is therefore possible to rapidly cool the substrate mounted on the holding table of the thermal unit without impairing the evenness of the temperature distribution on the substrate, and consequently to appropriately keep the evenness of the film thickness and the evenness of the line width of the substrate which is subjected to a heat processing.

The present invention is also directed to a method for performing a heat processing on a substrate.

According to the present invention, a heat processing method includes the steps of: mounting a substrate on a holding table which includes a housing having therein an inner space serving as a working domain of working fluid in a heat pipe structure; heating the working fluid, the heat of which is transferred to the substrate through the heat pipe structure and the holding table, whereby the substrate is heated, by using a heating part attached to the holding table; and cooling the substrate mounted on the holding table by using a cooling structure disposed on the inner space.

It is therefore possible to rapidly cool the substrate mounted on the holding table without impairing the evenness of the temperature distribution on the substrate, and consequently to appropriately keep the evenness of the film thickness and the evenness of the line width of the substrate which is subjected to a heat processing.

Consequently, an object of the present invention is to provide a heat processing device capable of rapidly cooling a mounting face while evenly keeping the temperature distribution of the mounting face and a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows configuration of a first processing unit group and a second processing unit group of the substrate processing device in FIG. 1;

DESCRIPTION OF THE PREFERRED EMBODIMENTS

Hereinafter, preferred embodiments of the present invention will be described in detail with reference to the drawings.

Figure 1:
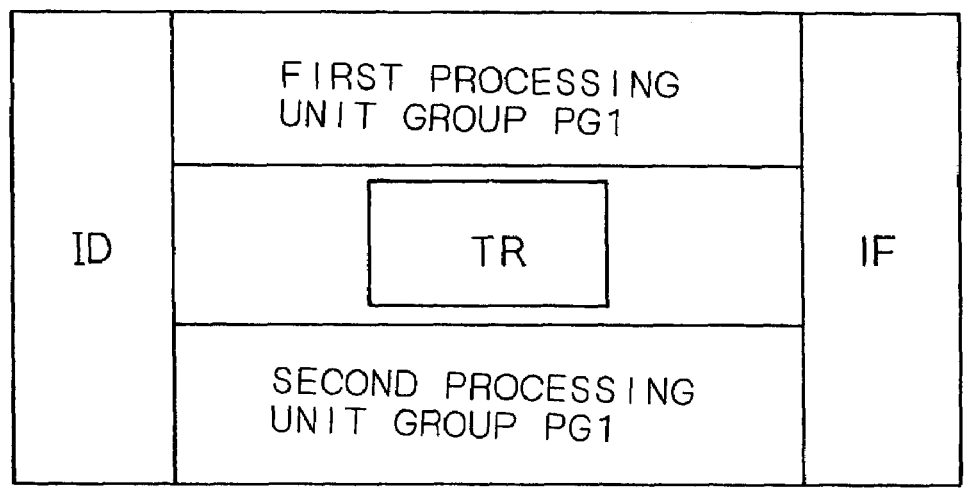
FIG. 1 is a plan view showing the entire configuration of a substrate processing device according to a preferred embodiment of the present invention.
Figure 1:
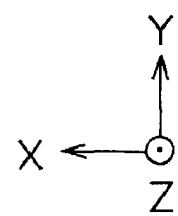

1. First Preferred Embodiment 1.1. Schematic Configuration of Substrate Treating Device FIG. 1 is a plan view showing the entire configuration of a substrate processing device 1 according to a first preferred embodiment of the present invention. It is noted that FIG. 1 and the following figures are indicated by an XYZ orthogonal coordinate system with the Z-axis direction being set to the perpendicular direction and the XY plane being set to the horizontal plane, if necessary, for the purpose of clearly indicating the relationship among those directions in the respective figures.

This substrate processing device 1, which is a device for performing a resist application processing and a development processing on a substrate, includes: an indexer ID for carrying in and out a substrate; a first processing unit group PG1 and a second processing unit group PG2 that are constituted by a plurality of processing units for performing processings on the substrate; an interface IF for transmitting and receiving the substrate to and from an exposure device which is not shown; and a transportation robot TR.

The indexer ID, which has a carrier (not shown) placed thereon capable of housing a plurality of substrates, is provided with a transferring robot. The indexer ID transmits an unprocessed substrate from the corresponding carrier to the transportation robot TR, and receives a processed substrate from the transportation robot TR and stores it in the carrier.

The interface IF has a function of receiving a substrate which has been subjected to a resist application processing from the transportation robot TR to transmit the substrate to an exposure device which is not shown, while receiving a substrate which has been exposed to transmit the substrate to the transportation robot TR. The interface IF also has a buffer function of temporarily stocking a substrate before or after exposure so as to adjust the transmitting and receiving timing to and from the exposure device. Although not shown in the figures, the interface IF includes a robot for transmitting and receiving a substrate to and from the transportation robot TR and a buffer cassette on which the substrate is mounted.

The substrate processing device 1 includes a plurality of processing units for performing processings on a substrate, and a part thereof constitutes a first processing unit group PG1, and the rest thereof constitutes a second processing unit group. FIG. 2 shows configurations of the first processing unit group PG1 and the second processing unit group PG2. The first processing unit group PG1 is arranged so that a plurality of heat processing units are placed above application processing units SC1, SC2 (resist application processing units) serving as liquid processing units. Here, in FIG. 2, for convenience of description, the processing units are placed two-dimensionally; however, in an actual state, the processing units are stacked in the height direction (Z-axis direction).

Each of the application processing units SC1, SC2 is a so-called spin coater which performs a resist application processing evenly by supplying photoresist onto a substrate main face with the substrate being rotated. Above the application processing units SC1, SC2, three rows of heat processing units are provided in a manner so as to be stacked in three stages. In other words, one row consisting of a cooling unit CP1, an adhesion reinforcing unit AH (adhesion reinforcing processing part) and a heating unit HP1 that are stacked in this order from below, another row consisting of a cooling unit CP2, a heating unit HP2 and a heating unit HP3 that are stacked in the same manner, and the other row consisting of a cooling unit CP3, a heating unit HP4 and a heating unit HP5 that are stacked in the same manner are placed.

In the same manner, the second processing unit group PG2 is constituted by development processing units SD1, SD2 that serve as liquid processing units and a plurality of heat processing units that are placed above these. Each of the development processing units SD1, SD2 is a so-called spin developer which performs a development processing by supplying a developing liquid onto the substrate after exposure. Above the development processing units SD1, SD2, three rows of heat processing units are provided in a manner so as to be stacked in three stages. More specifically, one row consisting of a cooling unit CP4, a post-exposure bake unit PEB, and a heating unit HP6 that are stacked in this order from below, another row consisting of a cooling unit CP5, a heating unit HP7 and a heating unit HP8 that are stacked in the same manner, and the other row consisting of a cooling unit CP6, a heating unit HP9 and a heating unit HP10 that are stacked in the same manner are placed.

The heating units HP1 to HP10 are so-called hot plates that heat a substrate up to a predetermined temperature. Moreover, the adhesion reinforcing unit AH heats the substrate prior to the resist application and the post-exposure bake unit PEB heating unit heats the substrate immediately after the exposure. The cooling units CP1 to CP6 are so-called cool plates that cool the substrate down to a predetermined temperature, and keep the substrate at the predetermined temperature.

In the present specification, these units (heating units and cooling units) for performing temperature adjustments on the substrate are referred to as heat processing units. Further, processing units, such as the application processing units SC1, SC2 and the development processing units SD1, SD2, which supply processing liquids to the substrate to perform predetermined processings are referred to as liquid processing units. Moreover, the liquid processing units and heating processing units are collectively referred to as processing units.

Here, above each of the liquid processing units, a filter fan unit FFU, which forms a downward flow of clean air with controlled temperature and humidity, is provided on the liquid processing unit side. Moreover, although not shown in the figure, above the position at which the transportation robot TR is placed, a filter fan unit which forms a downward flow of clean air toward a transporting space is provided.

In the first preferred embodiment, in particular, the heating units HP1 to HP10, which are constituent elements for the first processing unit group and the second processing unit group PG2, are allowed to have configurations according to the features of the present invention. Hereinafter, one heating unit HP1 will be described; however, the other heating units HP2 to HP10 are also described in the same manner.

1.2. Configuration of Heating Unit

Figure 3:
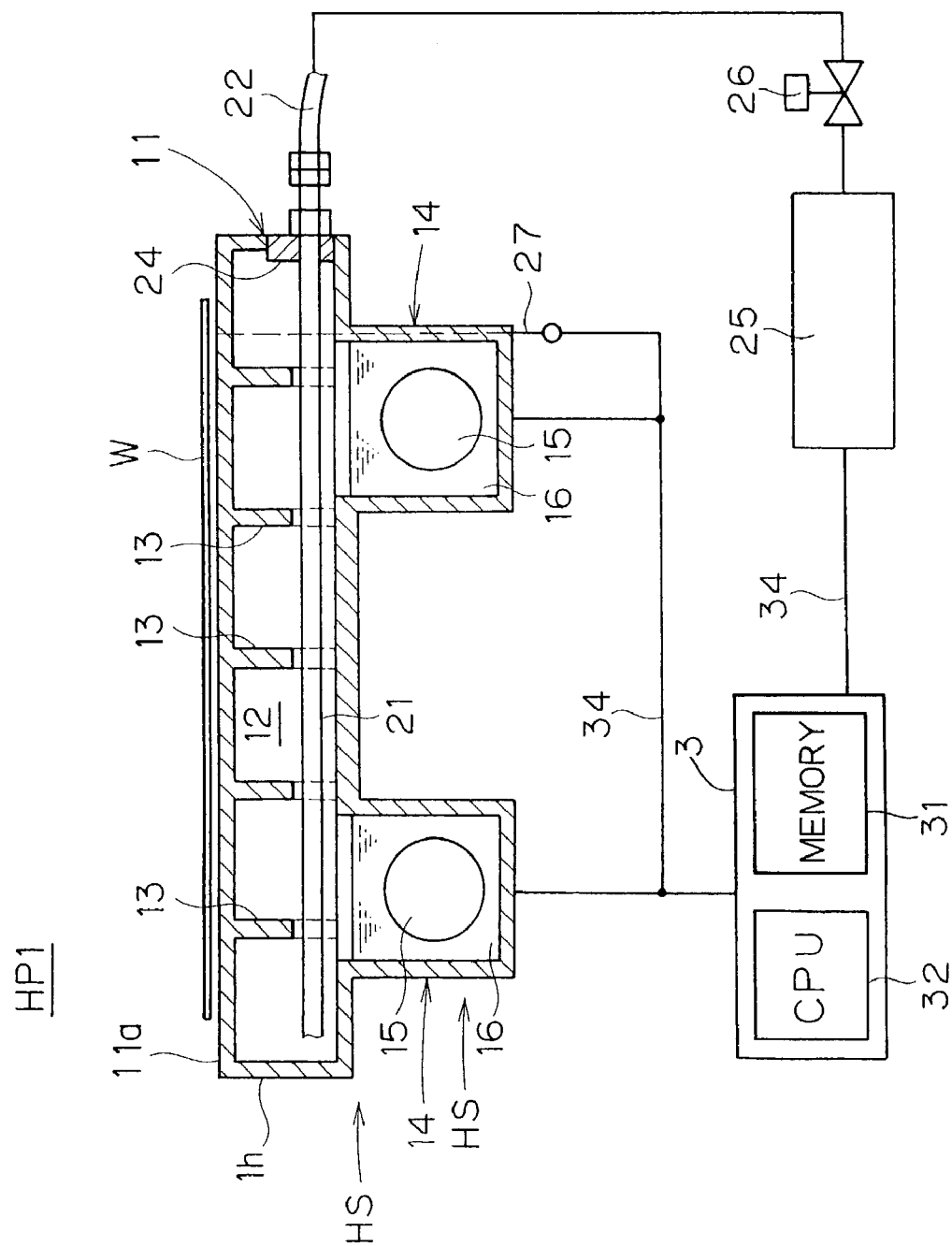
FIG. 3 is a front view of a heating unit according to a first preferred embodiment.
Figure 4:
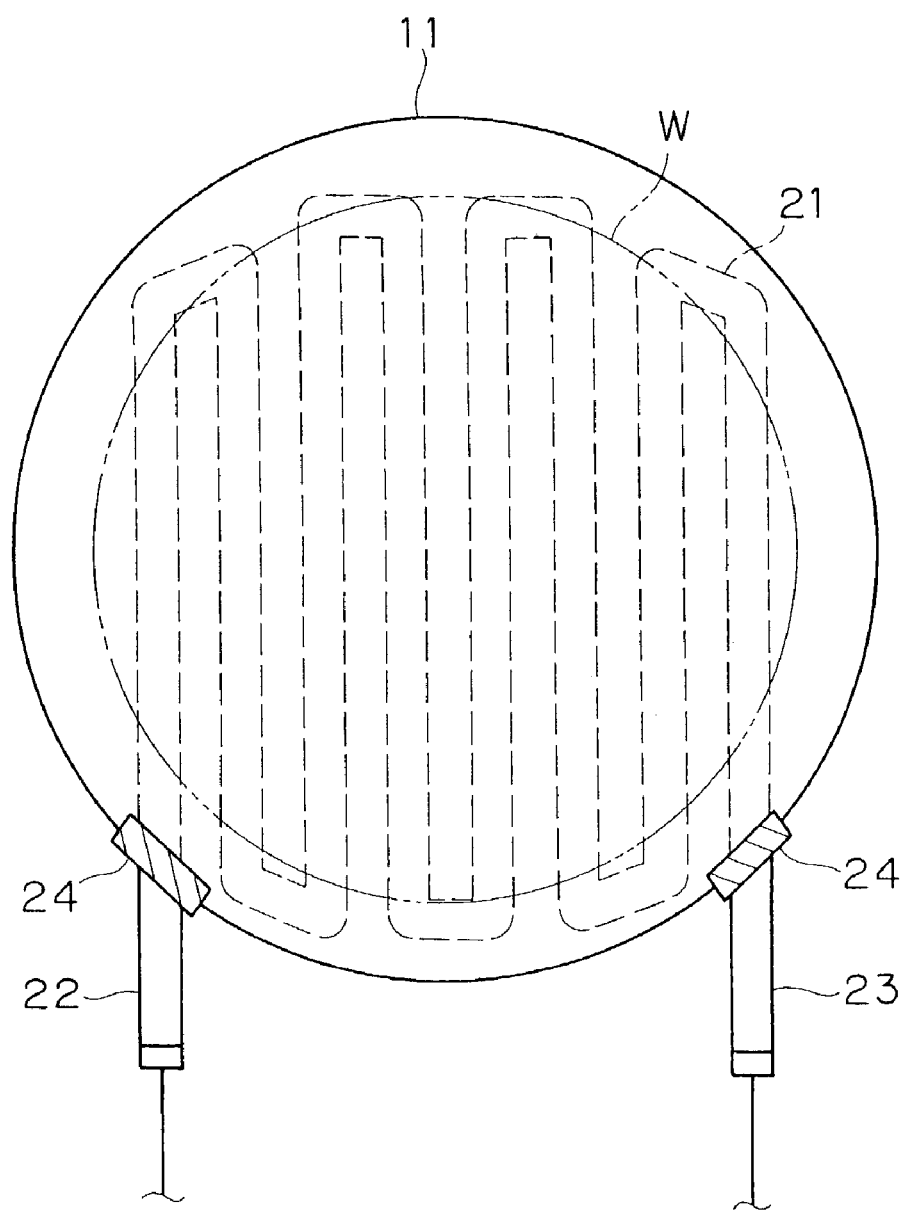
FIG. 4 is a plan view of a holding table according to the first preferred embodiment.

FIG. 3 is a front view showing a heating unit HP1, and FIG. 4 is a plan view showing a holding table 11 in FIG. 3.

The holding table 11, which has an extremely small heat capacity with high in-plane evenness in the temperature distribution by adopting the heat pipe structure HS, includes a housing 1h which is formed as a flat box member made of metal, and a substrate W is mounted on a mounting face 11a corresponding to the upper face thereof. A plurality of small balls made of ceramics, not shown, are embedded in the mounting face 11a in a dispersed manner so that the substrate W is supported in a point-contact state so as to prevent heat processing irregularities; however, the substrate W may be supported in a face-contact state by omitting the small balls.

A cavity is formed inside the holding table 11 with the housing 1h serving as a wall face. The inner space 12 is depressurized by the heat pipe structure HS, and a plurality of pillars 13 are erected to compensate for the strength in the vertical direction.

A heater 15 is installed in a working liquid room 14 located at a lower portion of the holding table 11, and working liquid 16 is stored therein. In the first preferred embodiment, water is used as the working liquid 16. Moreover, the working liquid room 14 and the inner space 12 of the holding table 11 are communicated with each other. For this reason, steam of the working fluid 16, generated by heating the heater 15, is allowed to shift through the inner space 12 serving as a working domain and give or receive latent heat of vaporization so that the mounting face 11a is heated rapidly with the temperature distribution of the mounting face 11a being kept evenly.

A cooling pipe 21, which is made of a heat conductive material (for example, metal and alloy), and serves as the cooling structure in this device, is allowed to penetrate the inner space 12 in the holding table 11 approximately horizontally and pass through substantially the entire area of the mounting face 11a.

The cooling pipe 21 is connected to a refrigerant supplying source 25 through a supply valve 26 and a supply pipe 22, and drains, not shown, are connected through the cooling pipe 21 and a discharging pipe 23. Therefore, the refrigerant to be supplied from the refrigerant supplying source 25 is supplied to the cooling pipe 21 through the supply pipe 22 by opening the supply valve 26, and after heat exchange has been performed with the inner space 12 of the holding table 11 through the cooling pipe 21, it is discharged to a drain, not shown, through the discharging pipe 23. In other words, the cooling pipe 21 has its surface made in contact with the working fluid inside the inner space 12 so that the cooling function is exerted to the mounting face 11a through the working fluid. That is, the working fluid in the heat pipe structure HS can be heated by the heater 15, and can also be cooled by the cooling pipe 21.

Moreover, as shown in FIG. 4, in order to increase its surface area, the cooling pipe 21 is designed so as to be bent over several times in a winding manner in the inner space 12 of the holding table 11. For this reason, it is possible to perform heat exchange between the cooling pipe 21 and the inner space 12 efficiently.

Moreover, the cooling pipe 21 is supported on the wall face of the housing 1h of the holding table 11 through a ring-shaped (doughnut shape) heat-insulating member 24 attached to the holding table 11. For this reason, since the cooling pipe 21 and the holding table 11 are thermally insulated from each other by the heat-insulating member 24, this structure prevents direct heat transfer from the cooling pipe 21 to the holding table 11. With respect to the heat-insulating member 24, for example, ceramics and heat-insulating resin may be used.

A temperature sensor 27 is embedded in the holding table 11 so as to allow it to measure the temperature of the mounting face 11a. The temperature of the substrate W placed on the mounting face 11a is calculated on the basis of the temperature measured by this temperature sensor 27.

A control unit 3, which is connected to a control subject unit through a signal line 34, includes a memory 31 for storing programs, variables and the like, and a CPU 32 which executes controls in accordance with the programs stored in the memory 31. In accordance with the programs stored in the memory 31, the CPU 32 executes a heating control by using the heater 15 and a cooling control by using the refrigerant supplying source 25 and the supply valve 26 in accordance with predetermined timing based upon the temperature monitored by, for example, the temperature sensor 27.

1.3. Temperature Adjustment Control

Figure 5A:
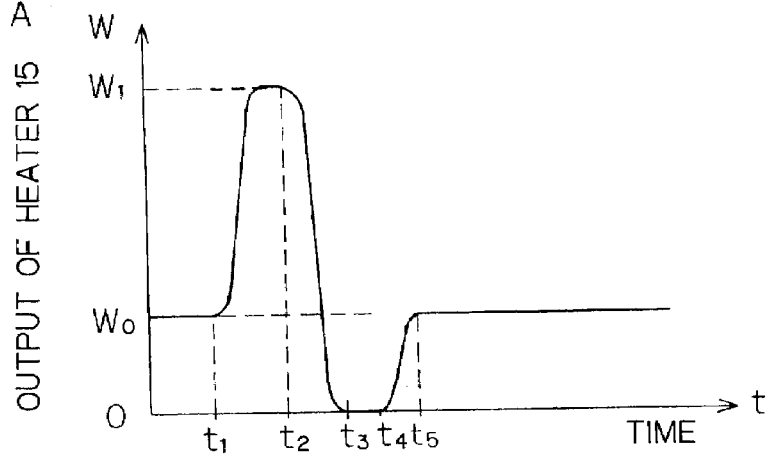
FIGS. 5A to 5C are graphs showing the timing of heating and cooling controls upon adjusting a set temperature and the temperature of a mounting face according to the first preferred embodiment.
Figure 5B:
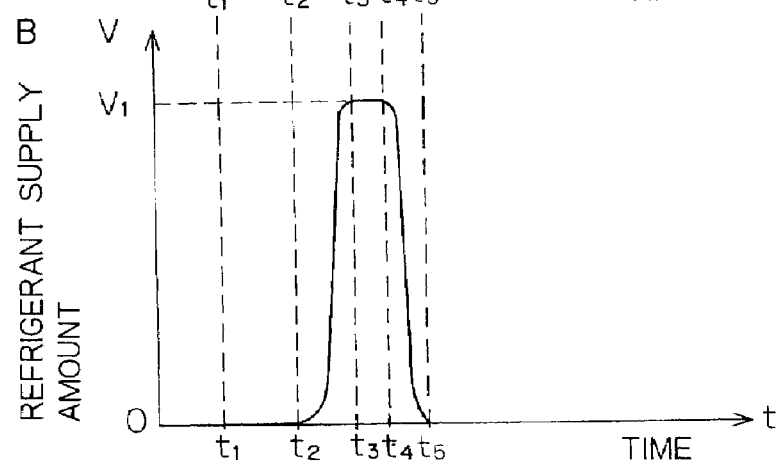
Figure 5C:
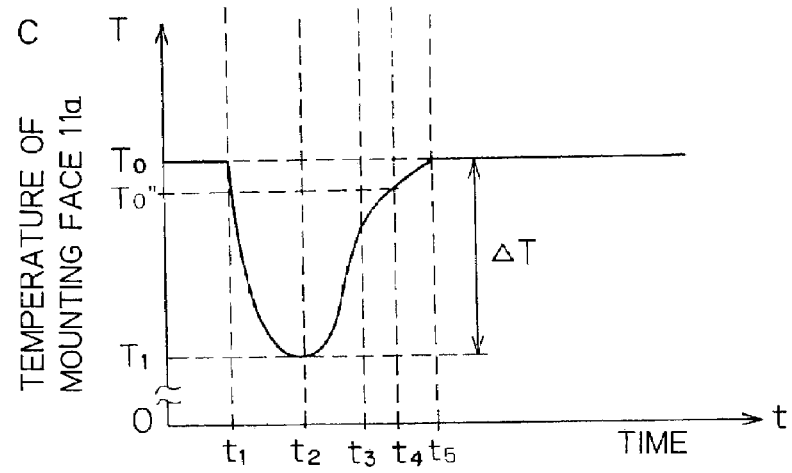

The following description will be given of a temperature adjustment control of the mounting face 11a by means of the heating unit HP1. FIGS. 5A to 5C show the relationship between timing indicating control of the heater 15 and the refrigerant supplying source 25 and the temperature of the mounting face 11a. The axis of abscissas of each of FIGS. 5A to 5C indicates time t, while the axis of ordinates of FIG. 5A indicates the output W of the heater 15, the axis of ordinates of FIG. 5B indicates the amount V of the refrigerant to be supplied from the refrigerant supplying source 25 to the cooling pipe 21 and the axis of ordinates of FIG. 5C indicates the temperature T of the mounting face 11a monitored by the temperature sensor 27, respectively.

At a point of time prior to time t1, the output of the heater 15 is maintained at a constant output W0, with the supply valve 26 being closed. Since no refrigerant is supplied from the refrigerant supplying source 25 to the cooling pipe 21, the mounting face 11a is maintained at the set temperature T0.

When, at time t1, a substrate W is received from the transportation robot TR and transmitted on the mounting face 11a, heat transfer occurs from the mounting face 11a to the substrate W, causing the temperature T of the mounting face 11a to drop from T0. When the temperature sensor 27 detects this temperature drop, the control unit 3 allows the output value of the heater 15 to gradually increase from W0 toward W1 which is the maximum output.

During the period from time t1 to time t2, the output value of the heater 15 is set to a constant value W1 so that the supply of heat to the mounting face 11a becomes greater to compensate for a reduction of heat released from the mounting face 11a to the substrate W. Thus, the rate of drop of the temperature of the mounting face 11a becomes smaller, with the result that the temperature gradient of the temperature curve shown in FIG. 5C becomes gradually milder. Then, at time t2 when the heat released from the mounting face 11a to the substrate W and the heat transferred from the heater 15 to the mounting face 11a are substantially in balance against each other, the temperature is set to the minimum value T1 while the temperature gradient value changes from negative to positive.

When, at time t2, the temperature sensor 27 detects a minimum point at which the temperature gradient of the mounting face 11a changes from negative to positive, the output value of the heater 15 is gradually decreased from W1 as shown in FIG. 5A, with the supply valve 26 being opened, so that the refrigerant supply from the refrigerant supplying source 25 to the cooling pipe 21 is started with the amount of supply being gradually increased.

Successively, at time t3 when the temperature of the mounting face 11a has reached a temperature which is lower than the set temperature T0 by a predetermined value, the output of the heater 15 is stopped with the amount of supply of the refrigerant from the refrigerant supplying source 25 to the cooling pipe 21 being set to the maximum value V1.

During the period from time t3 to time t4, the refrigerant is supplied from the refrigerant supplying source 25 to the cooling pipe 21 at the maximum amount of supply V1 so that the mounting face 11a is further cooled with the result that the temperature gradient of the temperature curve shown in FIG. 5C is further reduced.

Here, while the output value of the heater 15 is reduced gradually (smoothly) as time elapses, the amount of supply of the refrigerant from the refrigerant supplying source 25 to the cooling pipe 21 is gradually (smoothly) increased, and the amount of supply of the refrigerant is further maintained at the maximum amount of supply V1 for a predetermined time; thus, this arrangement makes it possible to prevent the occurrence of a so-called overshoot in the temperature fluctuation in which the temperature of the mounting face 11a becomes higher than the set temperature T0 even after the stop of the heater 15, and also to shorten the time required for the set temperature T0 to be achieved.

When, at time t4, the temperature sensor 27 has detected the fact that the temperature T of the mounting face 11a has reached temperature T0'', the supply valve 26 is closed so that the amount of supply of the refrigerant from the refrigerant supplying source 25 to the cooling pipe 21 is gradually decreased from time t4 to time t5, while the output value of the heater 15 is gradually increased from zero to the constant output W0. Thus, the temperature of the mounting face 11a and the substrate W is maintained at the set temperature T0.

The controlling property of the cooling processing in such temperature adjustments is influenced by the selection of the heat capacity and the amount of temperature adjustment (range in which the temperature is increased and reduced by the cooling processing) of the refrigerant to be used.

For example, when the cooling processing is performed by using a refrigerant that has a great heat capacity although the amount of temperature adjustment is small, an undershoot occurs in which the temperature thereof becomes lower than the set temperature T0 even after the stop of the cooling processing. In contrast, when the cooling processing is performed by using a refrigerant which has a small heat capacity although the amount of temperature adjustment is great, the time required for the cooling processing becomes longer.

For this reason, the refrigerant to be used for the cooling processing is preferably selected by taking the compatibility between the heat capacity of the refrigerant and the amount of temperature adjustment into consideration.

In the first preferred embodiment, at the time when the substrate W is mounted on the mounting face 11a, the amount of temperature drop $\Delta T$ (=T0−T1) is approximately 2 to 3 degrees which are comparatively small; therefore, air which has a small heat capacity is used as the refrigerant.

1.4. Advantages of Heating Unit of First Preferred Embodiment

In the above preferred embodiment, the heating unit HP1 having the heat pipe structure HS includes the cooling pipe 21 in the inner space 12 of the holding table 11, with the holding table 11 and the cooling pipe 21 being thermally insulated by the heat insulating member 24. For this reason, the cooling operation from the cooling pipe 21 is exerted on the mounting face 11a (that is, the substrate W) through the working fluid of the heat pipe structure HS so that it is possible to provide high cooling evenness and high cooling response. Moreover, different from the heat processing device shown in Japanese Patent Application Laid-Open No. 2001-313328, direct heat transfer is not exerted between the cooling part and the mounting face 11a so that it is possible to rapidly perform the cooling processing while the evenness of the temperature distribution of the mounting face 11a and the evenness of the temperature distribution of the substrate W mounted on the mounting face 11a are appropriately maintained, and also to desirably maintain the evenness of the film thickness and the line width of a wiring layer formed on the substrate during the heat processing.

Moreover, since the cooling pipe 21 is disposed in the inner space of the holding table 11 in a winding manner with an increased surface area of the cooling pipe 21, the heat exchange is efficiently performed from the refrigerant, supplied from the refrigerant supplying source 25 to the cooling pipe 21, to the inner space 12 of the holding table 11.

Furthermore, when the range of fluctuation in the set temperature of the mounting face 11a and the substrate W is a comparatively small range of 2 to 3 degrees as in the case of the first preferred embodiment, air is used as the refrigerant so that it is possible to improve the controllability of the cooling processing using the cooling pipe 21 in the set-temperature adjustments, and consequently to shorten the time required for the temperature of the mounting face 11a and the substrate W to be recovered to the set temperature T0.

2. Second Preferred Embodiment

Figure 8:
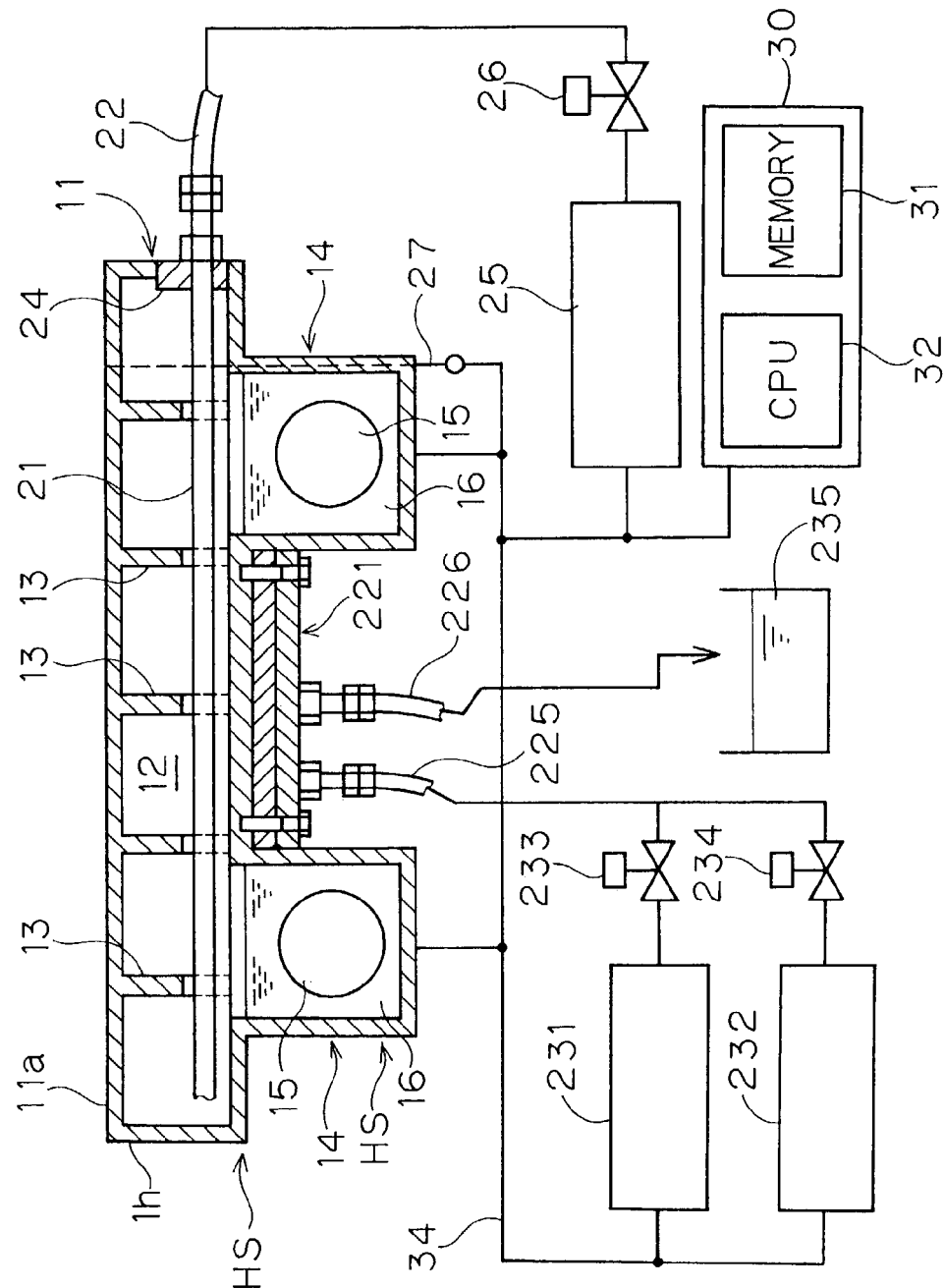
FIG. 8 is a front view of a heating unit according to a second preferred embodiment.

Next, the following description will be given of a second preferred embodiment. FIG. 8 is a front view which schematically shows a heating unit 200 in the second preferred embodiment of the present invention. As shown in FIG. 8, in comparison with the first preferred embodiment, the hardware configuration of the heating unit 200 in the second preferred embodiment is similar to the heating unit HP1 of the first preferred embodiment except for the following devices that are further added thereto:

(1) a cooling plate 221 disposed on the lower face side of the housing 1h;
(2) a refrigerant supplying source 232 for supplying refrigerant to the cooling plate 221; and
(3) a compressed air supplying source 231 for supplying compressed air to the cooling plate 221. The addition of these pieces of hardware makes it possible to perform the following processings by using independent cooling units:

(A) a temperature control for rapidly dropping the set temperature of the mounting face 11a by rapidly cooling the housing 1h by the use of the heater 15 and the cooling plate 221; and
(B) a temperature control for keeping the temperature of the mounting face 11a at a set temperature by using the heater 15 and the cooling pipe 21. Thus, it becomes possible to perform the temperature control (corresponding to (A)) for rapidly changing the set temperature of the mounting face 11a and the temperature control (corresponding to (B)) for finely adjusting the set temperature of the mounting face 11a by using respectively different cooling units. Therefore, it becomes possible to adjust the temperature control of the mounting face 11a with higher precision. The following description will be mainly given of these added constituent elements.

Here, in the following description, those constituent elements that are similar to those in the heating unit HP1 of the first preferred embodiment are indicated by the same reference numerals. Those constituent elements having the same reference numerals have been described in the first preferred embodiment; therefore, the description thereof will not be repeated.

Moreover, the heating unit 200 of the present preferred embodiment may be used as the heating units HP1 to HP10 that are constituent elements of the first processing unit group and the second processing unit group PG2 described in the first preferred embodiment. Therefore, even when each of the heating units HP1 to HP10 is replaced by the heating unit 200, it is possible to constitute the same substrate processing device as the device 1.

2.1. Configuration of Heating Unit

Figure 9:
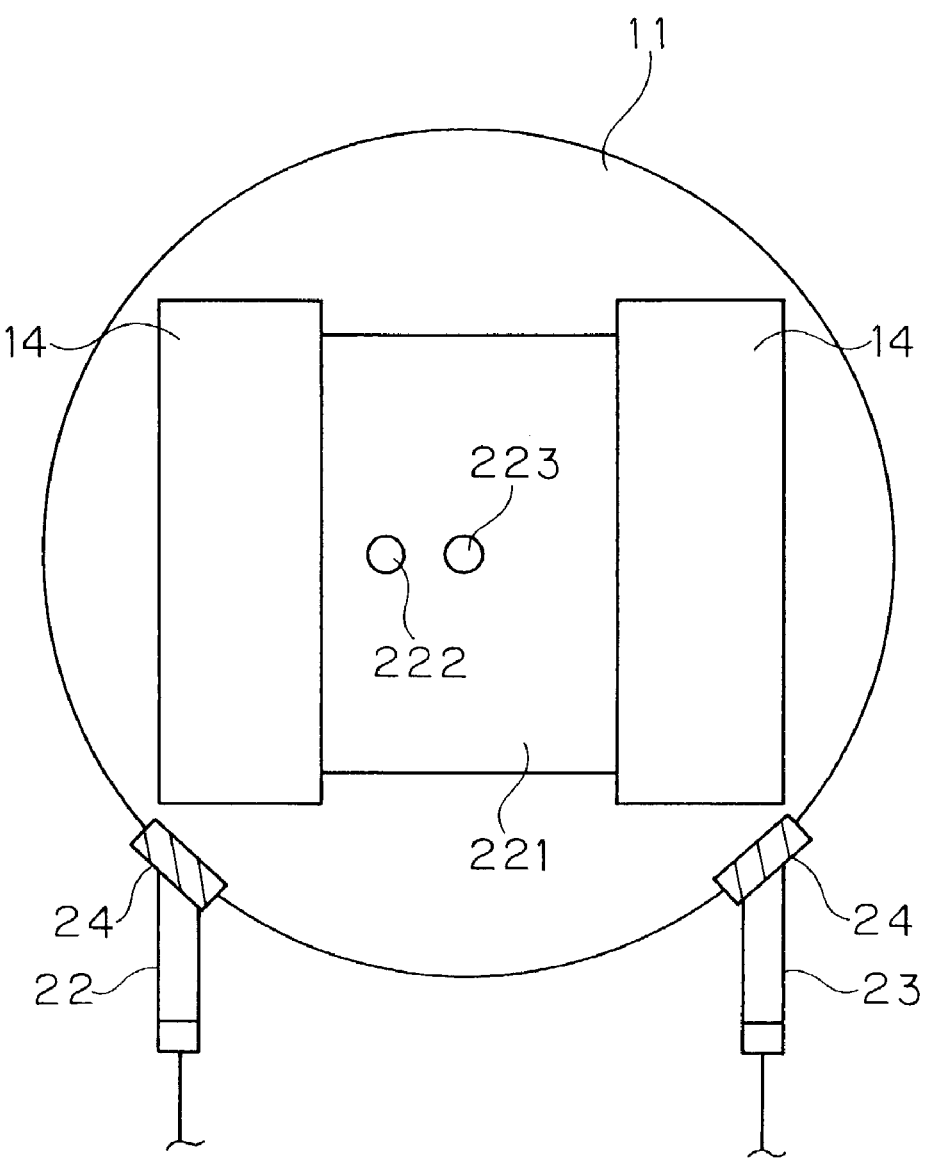
FIG. 9 is a plan view of a housing according to the second preferred embodiment when viewed from below.
Figure 10:
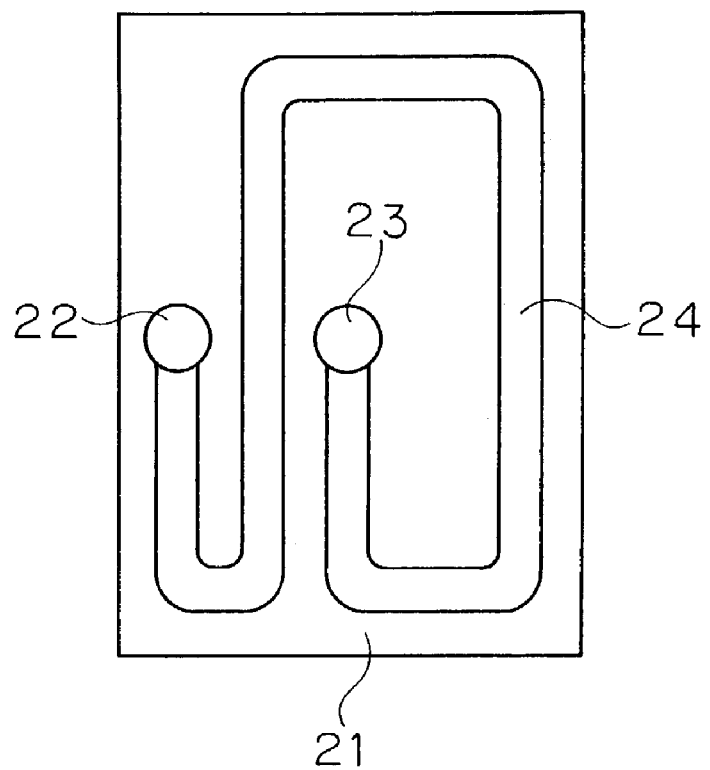
FIG. 10 shows a cooling plate according to the second preferred embodiment.

FIG. 9 shows a housing 1h of the present preferred embodiment when viewed from below. Moreover, FIG. 10 shows a cooling plate 221 in the case where the housing 1h of the present preferred embodiment is viewed from below. A cooling plate 221, which serves as a cooling structure of this device, is a member formed by bonding two metal plates having high heat conductivity to each other, and is placed between two working liquid rooms 14 disposed at a lower portion of the housing 1h in a manner so as to bring into contact with the lower face side of the housing 1h.

As shown in FIG. 10, a flow passage 224 is formed in the joined face of the cooling plate 221, and one end of the flow passage 224 is connected to a flow inlet 222, and the other end is connected to a flow outlet 223. Moreover, the flow passage 224, which starts from the flow inlet 222 to reach the flow outlet 223, is formed in a winding manner so as to provide a long flow passage length.

The flow inlet 222 is connected to a pipe 225 so as to communicate with each other. Further, this is allowed to communicate with a compressed air supplying source 231 through a valve 233, and also to communicate with a refrigerant supplying source 232 through a valve 234 that supplies the refrigerant. For this reason, by opening the valve 234 with the valve 233 being closed, it is possible to supply the refrigerant to the flow passage 224. Moreover, by closing the valve 234 with the valve 233 being opened, it is possible to supply compressed air to the flow passage 224. Moreover, the flow outlet 223 is allowed to communicate with drain 235 through a pipe 226.

The following description will be given of a processing for cooling the mounting face 11a of the holding table 11 by using the cooling plate 221. When the refrigerant is supplied to the flow passage 224 from the refrigerant supplying source 232, heat of the mounting face 11a reaches the flow passage 224 of the cooling plate 221 through the inner space 12, the cooling pipe 21 and the bottom (lower face side) of the housing 1h. The heat thus transferred is heat-exchanged by the refrigerant flowing through the flow passage 224. Moreover, the refrigerant inside the flow passage 224 is discharged to the drain 235 through the pipe 226. In this manner, the heat of the mounting face 11a is transmitted to, and received by the refrigerant supplied to the flow passage 224, and the refrigerant after the heat exchanging is successively discharged outside the flow passage 224 so that the mounting face 11a is cooled. Upon completion of the cooling processing of the mounting face 11a, the residual refrigerant in the flow passage 224 is discharged to the drain 235 outside the flow passage 224 by supplying compressed air to the flow passage 224. Thus, it is possible to prevent the cooling plate 221 from being heated by the heater 15 with the refrigerant remaining in the flow passage 224 and consequently to prevent the refrigerant in the flow passage 224 from being boiled to cause adverse effects on the heat processing. Here, with respect to the refrigerant, water may be simply used, or other refrigerants may be used.

In addition to the refrigerant supplying source 25, the supply valve 26 and the temperature sensor 27 described in the first preferred embodiment, the compressed air supplying source 231, the refrigerant supplying source 232, the valve 233, the valve 234 and the like are connected to the control unit 3 through signal lines 34. Therefore, in the same manner as the first preferred embodiment, in accordance with the programs stored in the memory 31, the CPU 32 performs the heating control by using the heater 15, the opening and closing controls by using the valves 233, 234, and the like, on the basis of the temperature monitored by, for example, the temperature sensor 27, in accordance with preset synchronized timing.

2.2. Temperature Adjustment Control

The following description will be given of temperature adjustment control of the mounting face 11a by the heating unit 200. Here, with respect to the temperature control by which the application of the heater 15 and the cooling pipe 21 makes it possible to maintain the temperature of the mounting face 11a at a preset temperature, the description thereof has been given in the first preferred embodiment. Therefore, in this preferred embodiment, description will be given of a temperature control in which the heater 15 and the cooling plate 221 are used so that the housing 1h is rapidly cooled so as to drop the set temperature of the mounting face 11a rapidly. Moreover, the following description will be given of a control in which the set temperature of the mounting face 11a is dropped without placing the substrate W thereon; however, the set temperature can be changed by using the same control also in the arrangement in which the substrate W is mounted thereon.

Figure 11A:
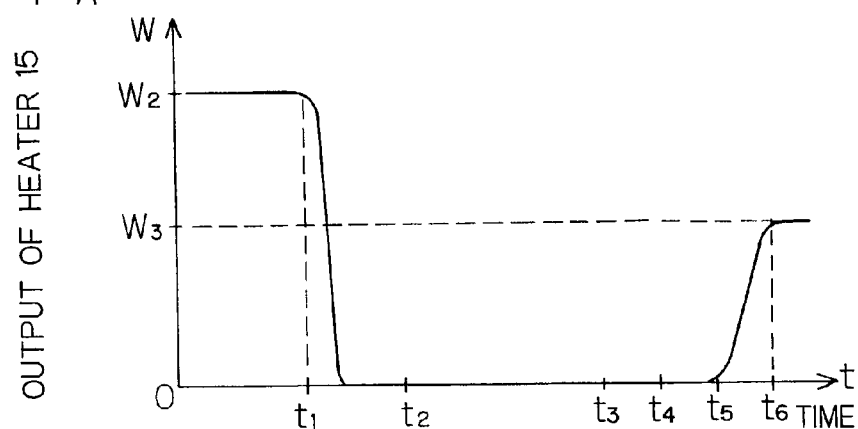
FIGS. 11A to 11C are graphs showing the timing of heating and cooling controls upon adjusting a set temperature and the temperature of a mounting face according to the second preferred embodiment.
Figure 11B:
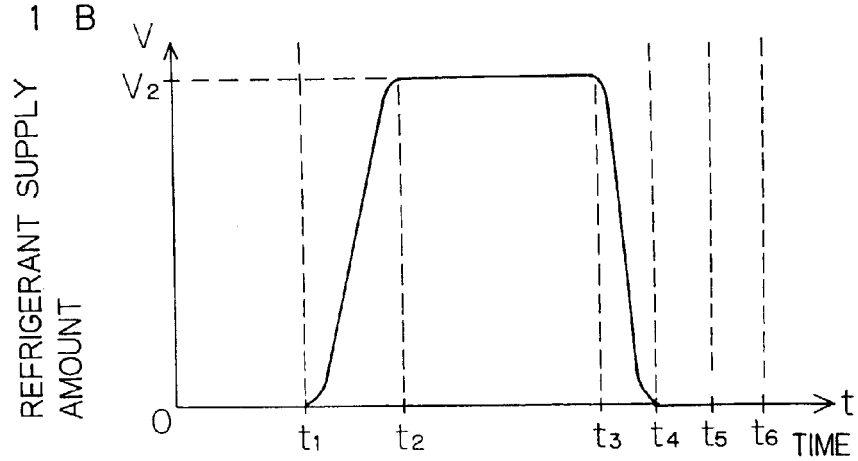
Figure 11C:
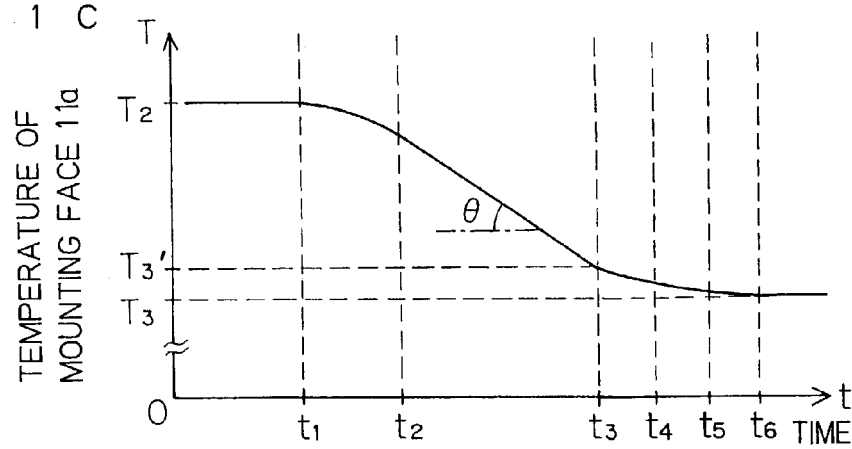

FIGS 11A to 11C show the relationships among the control timing of the heater 15, the amount of the supply of the refrigerant which is supplied from the refrigerant supplying source 232 and the temperature of the mounting face 11a. The axis of abscissas of each of FIGS. 11A to 11C indicates time t, while the axis of ordinates of FIG. 11A indicates the output W of the heater 15, the axis of ordinates of FIG. 11B indicates the amount V of the refrigerant to be supplied from the refrigerant supplying source 232 to the flow passage 224 and the axis of ordinates of FIG. 11C indicates the temperature T of the mounting face 11a monitored by the temperature sensor 27, respectively.

At a point of time prior to time t1, both of the valves 233, 234 are closed. Here, the output of the heater 15 is maintained at a constant output W2 so as to maintain the temperature of the mounting face 11a at a temperature T2 higher than room temperature. Moreover, in the temperature control to be described in the present preferred embodiment in which the set temperature of the mounting face 11a is rapidly dropped, the supply valve 26 is kept in the closed state since no cooling processing is performed by the cooling pipe 21; however, not limited to this arrangement, the mounting face 11a may be cooled by using the cooling plate 221 and the cooling pipe 21 in parallel with each other to cool the mounting face 11a so that the set temperature may be rapidly dropped.

At time t1 in which the temperature dropping processing of the set temperature T of the mounting face 11a is started, the control unit 3 transmits a control signal for changing the output W from W2 to "0" to the heater 15. Upon receipt of the corresponding instruction, the output W of the heater 15 is gradually reduced to "0".

Moreover, when the valve 234 is opened at time t1, the refrigerant is gradually increased from the refrigerant supplying source 232 toward the flow passage 224. Then, at time t2, the amount of supply of the refrigerant reaches the maximum value V2.

In this manner, during the period from time t1 to time t2, the output of the heater 15 is gradually reduced while the amount of supply of the refrigerant to be supplied to the flow passage 224 of the cooling plate 221 is gradually increased. Accordingly, the gradient of the temperature curve shown in FIG. 11C is gradually increased to reach the maximum value tan θ at time t2. Then, during time t2 to time t3, since the gradient of the temperature curve is set to be substantially constant with tan θ, the mounting face 11a is cooled rapidly.

When, at time t3, the temperature sensor 27 detects the fact that the temperature T of the mounting face 11a has reached temperature T3', the valve 234 is closed to stop the supply from the refrigerant supplying source 232 with the valve 233 being opened so that compressed air is supplied from the compressed air supplying source 231 toward the flow passage 224. Consequently, the supply of the refrigerant to the flow passage 224 is stopped while the residual refrigerant inside the flow passage 224 is discharged to the drain 235 outside the flow passage 224 by the compressed air so that the amount of the refrigerant inside the flow passage 224 is gradually reduced, causing the cooling capability of the cooling plate 221 to gradually drop. Moreover, at time t5 after a lapse of a fixed delay time from time t3 at which the valve 234 is closed to stop the supply from the refrigerant supplying source 232, the output W of the heater 15 is gradually increased from "0" toward W3. Therefore, the gradient of the temperature curve of the mounting face 11a becomes gradually mild.

Next, the amount of supply of the refrigerant to the flow passage 224 becomes "0" at time t4, and the output of the heater 15 becomes W3 at time t6 so that the temperature T of the mounting face 11a is set to a constant value T3, thereby completing the temperature control for rapidly dropping the set temperature of the mounting face 11a.

When, after the set temperature has been changed by the above-mentioned temperature control, a substrate W is mounted on the mounting face 11a that is maintained at the set temperature by the transportation robot TR, heat transfer occurs from the mounting face 11a to the substrate W so that the temperature of the mounting face 11a drops. In this case, by using the temperature control described in the first preferred embodiment, it is possible to keep the temperature of the mounting face 11a at the set temperature.

2.3. Advantage of Heating Unit of Second Preferred Embodiment

In the second preferred embodiment, in addition to the cooling pipe 21 placed in the inner space 12 of the holding table 11, the cooling plate 221 is provided on the bottom of the housing 1h so that the cooling state by the use of the cooling pipe 21 and the cooling state by the use of the cooling plate 221 are controlled to switch the two states or to use the two states in parallel with each other so as to perform the cooling processing. Therefore, depending on the temperature state of the mounting face 11a, the temperature control for dropping the set temperature of the mounting face 11a and the temperature control for keeping the set temperature of the holding table 11a at a fixed temperature can be performed in a switching manner so that the set temperature of the mounting face 11a is changed at high speeds with the temperature control of the mounting face 11a being adjusted with higher precision.

3. Modifications

Although the present invention has been described by reference to specific embodiments, the scope of the present invention is not limited to these embodiments, and various modifications thereof may be made.

(1) In the first preferred embodiment, air is used as the refrigerant; however, various fluids, for example, gases such as nitrogen and helium may be used, or liquids may be adopted.

(2) In the cooling pipe 21 of the first preferred embodiment and in the cooling pate 221 of the second preferred embodiment, a method in which a refrigerant is directed into a cooling passage so as to perform a cooling processing; however, not limited to this method, for example, a Peltier element may be utilized. In this case also, it is possible to enhance the evenness of the cooling processing by cooling the working fluid in the heat pipe structure.

(3) In the first preferred embodiment, the surface of the cooling pipe 21 is brought into contact with the working fluid inside the inner space 12 so as to perform heat exchange with the refrigerant inside the cooling pipe 21; however, the present invention is not limited by this method, and any method may be used as long as the working fluid and the cooling medium are thermally coupled to each other.

(4) The temperature control of the second embodiment may be applied to a case where the temperature of the mounting face 11a is finely adjusted to the set temperature with respect to the case where the temperature of the mounting face 11a becomes higher than the set temperature by mounting a substrate W having a temperature higher than the temperature of the mounting face 11a from the transportation robot TR onto the holding table 11. In this case, for example, the time (corresponding to the period from time t2 to time t3 shown in FIG. 11B) during which the amount of supply V of the refrigerant to be supplied to the cooling plate 221 is maintained at a fixed amount V2 is adjusted so that, even when the temperature of the mounting face 11a is raised through heat exchange from the substrate W, it can be held at a fixed temperature. Moreover, in the first and second preferred embodiments, the refrigerant may be supplied to the cooling pipe 21 in place of the cooling plate 221; thus, even in this case, it is possible to obtain the similar effects.

(5) Moreover, in the second preferred embodiment, the temperature control for rapidly dropping the set temperature of the mounting face 11a of the holding table 11 is performed by using the cooling plate 221; however, in such a case where the range of change in the set temperature is small, the set temperature may changed by using only the cooling pipe 21 without using the cooling plate 221.

Figure 6A:
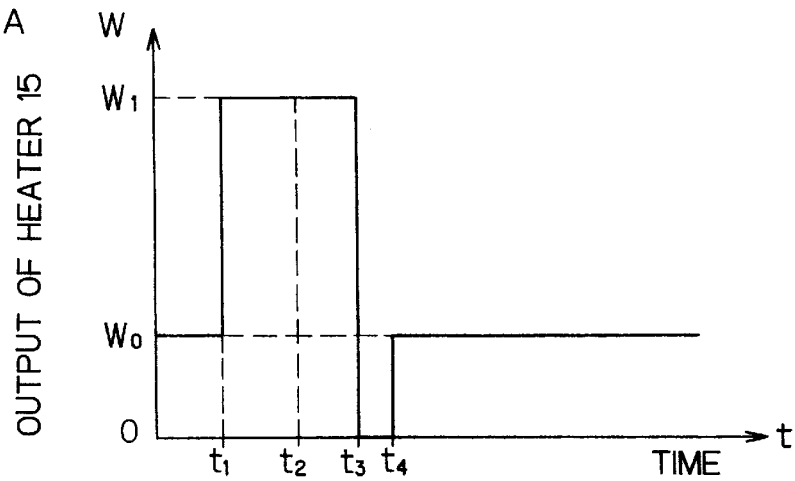
FIGS. 6A to 6C are graphs showing the timing of heating and cooling controls upon adjusting a set temperature and the temperature of a mounting face according to the first preferred embodiment.
Figure 6B:
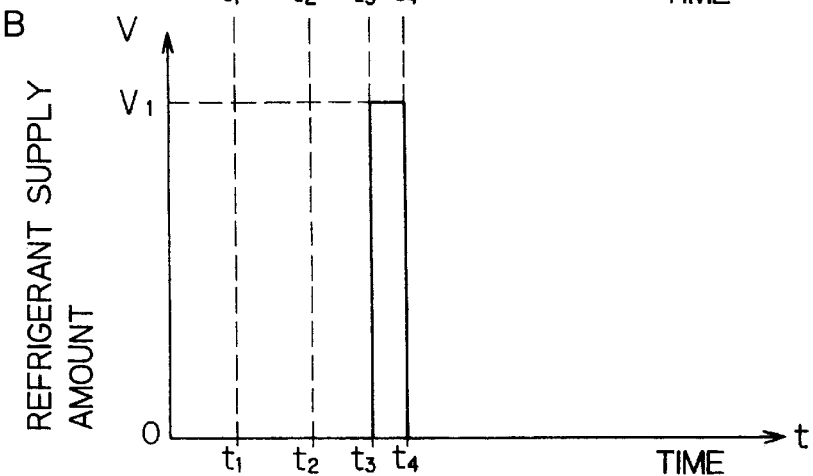
Figure 6C:
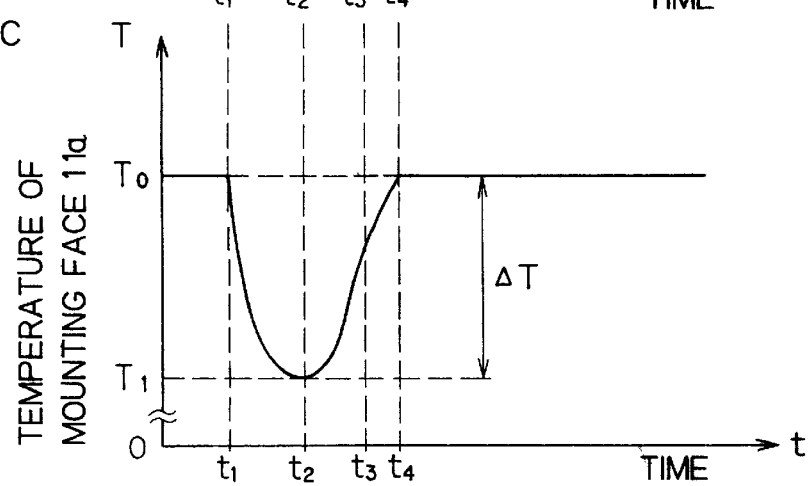
Figure 7:
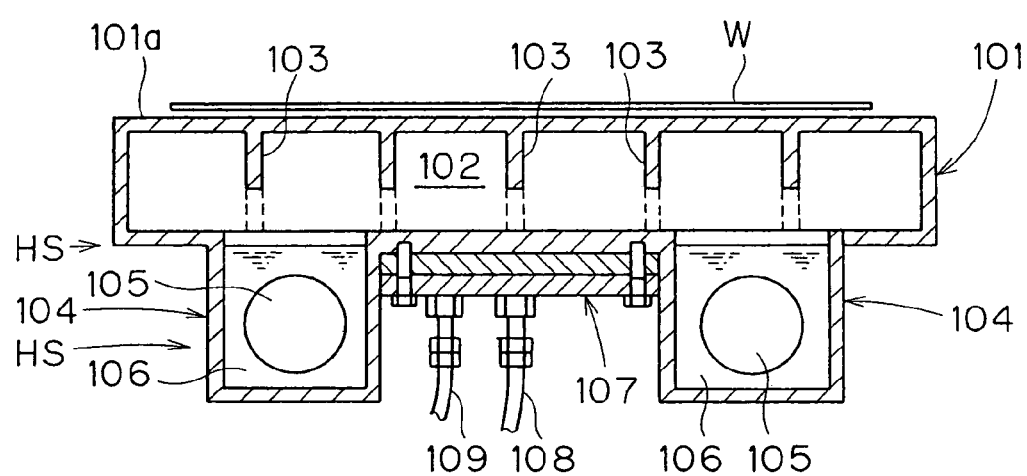
FIG. 7 shows the configuration of a main part of a conventional heat processing device.

(6) With respect to the temperature adjusting control of the mounting face 11a of the first preferred embodiment, it is not limited to the arrangement shown in FIGS. 5A to 5C. FIGS. 6A to 6C show another example of timing charts of the heating and cooling controls upon adjusting the set temperature and the mounting face temperature at that time.

The following description will be mainly given of points different from the embodiment shown in FIGS. 5A to 5C.

The axis of abscissas of each of FIGS. 6A to 6C indicates time t, while the axis of ordinates of FIG. 6A indicates the output W of the heater 15, the axis of ordinates of FIG. 6B indicates the amount V of the refrigerant to be supplied from the refrigerant supplying source 25 to the cooling pipe 21 and the axis of ordinates of FIG. 6C indicates the temperature T of the mounting face 11a monitored by the temperature sensor 27, respectively.

When, at time t1, a substrate W is received from the transportation robot TR and transmitted on the mounting face 11a so that the temperature T of the mounting face 11a changes from T0, the output value of the heater 15 is changed from W0 to W1 which is the maximum output.

During the period from time t1 to time t2, the output value of the heater 15 is set to a constant value W1 so that the supply of heat to the mounting face 11a becomes greater to compensate for a reduction of heat released from the mounting face 11a to the substrate W; thus, the rate of drop of the temperature of the mounting face 11a becomes smaller, with the result that the temperature gradient of the temperature curve shown in FIG. 6C becomes gradually milder. Then, at time t2 when the heat released from the mounting face 11a to the substrate W and the heat transferred from the heater 15 to the mounting face 11a are substantially in balance against each other, the temperature is set to the minimum value T1 while the temperature gradient value changes from negative to positive. Then, after time t2, the temperature difference between the mounting face 11a and the substrate W is further reduced.

Next, at time t3 when the temperature of the mounting face 11a has reached a temperature which is lower than the set temperature T0 by a predetermined value ΔT, the output of the heater 15 is stopped with the supply valve 26 being opened so that the supply of the refrigerant from the refrigerant supplying source 25 to the cooling pipe 21 is started.

During the period from time t3 to time t4, the refrigerant is supplied from the refrigerant supplying source 25 to the cooling pipe 21 at the maximum amount of supply V1 so that the mounting face 11a is continuously cooled down rapidly. Thus, the temperature gradient of the temperature curve shown in FIG. 6C is gradually reduced, with the result that the temperature gradient value becomes zero at time t4.

When, at time t4, the temperature sensor 27 detects the fact that the temperature T of the mounting face 11a has reached the set temperature T0, the supply valve 26 is closed so that the supply of the refrigerant from the refrigerant supplying source 25 to the cooling pipe 21 is stopped and the output value of the heater 15 is changed from zero to a fixed output W0; thus, the temperature of the mounting face 11a and the substrate W is maintained at the set temperature T0.

In this manner, by performing the cooling processing using the refrigerant after the heating processing by the heater 15, it becomes possible to prevent the occurrence of a so-called overshoot in the temperature fluctuation in which the temperature of the mounting face 11a becomes higher than the set temperature T0 even after the stop of the heater 15, and also to shorten the time required for the set temperature T0 to be achieved.

Moreover, in the above-mentioned temperature adjustment control, the description has been given of a case that, when the temperature of the mounting face 11a is reduced from the set temperature T0, the mounting face 11a is heated by controlling the amount of the refrigerant to be supplied to the heater 15 and the cooling pipe 21; however, the present invention may be applied to a case that, when the temperature of the mounting face 11*a* is increased from the set temperature T0, the mounting face 11*a* is cooled down.

While the invention has been shown and described in detail, the foregoing description is in all aspects illustrative and not restrictive. It is therefore understood that numerous modifications and variations can be devised without departing from the scope of the invention.

What is claimed is:

1. A device for thermally processing a substrate, comprising:
    a) a housing including a holding table for mounting said substrate thereon and also including a heat pipe structure, and a working fluid therein;
    b) a heater which is attached to said holding table to heat said holding table via said heat pipe structure;
    c) a first cooler which is thermally coupled to the working fluid in said heat pipe structure for cooling said working fluid; and
    d) a second cooler in contact with and disposed on a lower face of said housing or cooling said holding table.

2. A device for thermally processing a substrate, comprising:
    a) a housing including therein an inner space serving as a working domain of working fluid in a heat pipe structure and also including a holding table for mounting said substrate on an upper face of said housing;
    b) a heater which is attached to said holding table to heat said holding table via said heat pipe structure;
    c) a first cooler disposed in said inner space for cooling said holding table;
    d) a second cooler in contact with and disposed on a lower face of said housing for cooling said holding table; and
    e) a controller which controls the cooling state of said first cooler and the cooling state of said second cooler.

3. The heat processing device according to claim 2, wherein said second cooling structure has:
    d-1) a flow passage for a refrigerant;
    d-2) a refrigerant supplying part for supplying said refrigerant to said flow passage; and
    d-3) a gas supplying part for supplying a gas to said flow passage.

4. A device for processing a substrate, comprising:
    a) a thermal unit which includes
        a housing includig a holding table for mounting said substrate thereon and also including a heat pipe structure, and a working fluid therein,
        a heater which is attached to said holding table to heat said holding table via said heat pipe structure,
        a first cooler which is thermally coupled to working fluid in said heat pipe structure for cooling said working fluid, and
        a second cooler in contact with and disposed on a lower face of said housing for cooling said holding table; and
    b) a transportation mechanism which transports said substrate to said thermal unit.

5. A device for processing a substrate, comprising:
    a) a thermal unit which includes
        a housing including therein an inner space serving as a working domain of working fluid in a heat pipe structure and also including a holding table for mounting said substrate on an upper face of said housing,
        a heater which is attached to said holding table to heat said holding table via said heat pipe structure,
        a first cooler disposed in said inner space for cooling said holding table,
        a second cooler in contact with and disposed at a lower face of said housing for cooling said holding table, and
        a controller which controls the cooling state of said first cooler and the cooling state of said second cooler; and
    b) a transportation mechanism which transports said substrate to said thermal unit.

* * * * *